(12) United States Patent
Tossavainen et al.

(10) Patent No.: US 10,645,834 B2
(45) Date of Patent: May 5, 2020

(54) APPARATUS AND METHOD FOR PROVIDING HAPTIC AND AUDIO FEEDBACK IN A TOUCH SENSITIVE USER INTERFACE

(75) Inventors: Antero Tossavainen, Oulu (FI); Vesa Kajanus, Oulunsalo (FI); Petri Soronen, Oulu (FI)

(73) Assignee: Nokia Technologies Oy, Espoo (FI)

(*) Notice: Subject to any disclaimer, the term of this patent is extended or adjusted under 35 U.S.C. 154(b) by 978 days.

(21) Appl. No.: 13/818,225

(22) PCT Filed: Aug. 23, 2010

(86) PCT No.: PCT/IB2010/053783
§ 371 (c)(1),
(2), (4) Date: Jun. 10, 2013

(87) PCT Pub. No.: WO2012/025783
PCT Pub. Date: Mar. 1, 2012

(65) Prior Publication Data
US 2013/0250500 A1    Sep. 26, 2013

(51) Int. Cl.
*H05K 7/00*   (2006.01)
*G06F 3/01*   (2006.01)
(Continued)

(52) U.S. Cl.
CPC .............. *H05K 7/00* (2013.01); *G06F 3/016* (2013.01); *G06F 3/041* (2013.01); *G06F 3/04886* (2013.01); *G06F 3/167* (2013.01); *H04M 1/03* (2013.01); *H04R 7/045* (2013.01); *H04R 17/00* (2013.01); *G06F 2203/014* (2013.01); *H04R 2440/05* (2013.01); *H04R 2499/11* (2013.01)

(58) Field of Classification Search
CPC ....................................................... G06F 3/016
See application file for complete search history.

(56) References Cited

U.S. PATENT DOCUMENTS 6,429,846 B2   8/2002   Rosenberg et al.
6,580,799 B1   6/2003   Azima et al.
(Continued)

FOREIGN PATENT DOCUMENTS

CA    2465834 A1    5/2003
CN    1392977 A     1/2003
(Continued)

OTHER PUBLICATIONS

Runia, Andy & Pratap, Rudra; "Introduction to Statics and Dynamics;" Aug. 21, 2010; pp. 752-776.*
(Continued)

*Primary Examiner* — Amare Mengistu
*Assistant Examiner* — Crystal Mathews
(74) *Attorney, Agent, or Firm* — Harrington & Smith

(57) ABSTRACT

An apparatus comprising: a first part configured to form at least part of the case of the apparatus; a second part configured to form at least part of the display for the apparatus; a flexible membrane configured to couple at a first area of contact the first part and at a second area of contact the second part; and an actuator coupled to the second part and configured to apply a force to the second part to generate a substantially translational displacement of the second part.

26 Claims, 10 Drawing Sheets

(51) Int. Cl.
*H04M 1/03* (2006.01)
*G06F 3/041* (2006.01)
*G06F 3/0488* (2013.01)
*G06F 3/16* (2006.01)
*H04R 17/00* (2006.01)
*H04R 7/04* (2006.01)

(56) References Cited

U.S. PATENT DOCUMENTS

| | | | |
|---|---|---|---|
| 6,606,390 | B2 | 8/2003 | Azima |
| 6,985,596 | B2 | 1/2006 | Bank et al. |
| 7,342,573 | B2 * | 3/2008 | Ryynanen ............... 345/173 |
| 7,369,115 | B2 * | 5/2008 | Cruz-Hernandez ........................ B06B 1/0603 310/316.01 |
| 7,372,110 | B2 | 5/2008 | Hatano |
| 7,415,289 | B2 | 8/2008 | Salmon |
| 7,869,589 | B2 * | 1/2011 | Tuovinen ............... 379/433.07 |
| 8,760,413 | B2 * | 6/2014 | Peterson ............... G06F 3/016 200/600 |
| 2001/0040976 | A1 | 11/2001 | Buos |
| 2002/0075135 | A1 | 6/2002 | Bown |
| 2002/0149561 | A1 * | 10/2002 | Fukumoto ......... G01C 21/3664 345/156 |
| 2003/0067449 | A1 * | 4/2003 | Yoshikawa ........... G06F 3/0414 345/173 |
| 2003/0081799 | A1 | 5/2003 | Klasco et al. |
| 2003/0081800 | A1 | 5/2003 | Klasco et al. |
| 2004/0087346 | A1 | 5/2004 | Johannsen et al. |
| 2004/0212583 | A1 * | 10/2004 | Cobian ................ G06F 3/0414 345/156 |
| 2004/0227721 | A1 * | 11/2004 | Moilanen ............ G06F 1/1626 345/107 |
| 2004/0240687 | A1 | 12/2004 | Graetz |
| 2005/0111678 | A1 | 5/2005 | Wada et al. |
| 2006/0109254 | A1 * | 5/2006 | Akieda ................ G06F 3/016 345/173 |
| 2006/0232564 | A1 * | 10/2006 | Nishimura ............. G06F 3/016 345/173 |
| 2007/0057909 | A1 | 3/2007 | Schobben et al. |
| 2007/0080951 | A1 * | 4/2007 | Maruyama ............ G06F 1/1626 345/173 |
| 2007/0119698 | A1 | 5/2007 | Day |
| 2007/0202917 | A1 | 8/2007 | Phelps et al. |
| 2007/0229478 | A1 * | 10/2007 | Rosenberg ............. A63F 13/06 345/173 |
| 2008/0010593 | A1 | 1/2008 | Uusitalo et al. ........... 715/702 |
| 2008/0055277 | A1 * | 3/2008 | Takenaka ............. G06F 3/016 345/177 |
| 2008/0084384 | A1 * | 4/2008 | Gregorio .............. G06F 3/016 345/156 |
| 2009/0034758 | A1 * | 2/2009 | Ko et al. ................. 381/152 |
| 2009/0167507 | A1 * | 7/2009 | Maenpaa ............... 340/407.2 |
| 2009/0167701 | A1 * | 7/2009 | Ronkainen ............... 345/173 |
| 2010/0052880 | A1 * | 3/2010 | Laitinen et al. ........... 340/407.2 |
| 2010/0067726 | A1 * | 3/2010 | Suzuki ................ G06F 1/1605 381/333 |
| 2010/0141408 | A1 * | 6/2010 | Doy et al. ................ 340/407.2 |
| 2010/0156818 | A1 * | 6/2010 | Burrough ............. G06F 3/016 345/173 |
| 2010/0156824 | A1 * | 6/2010 | Paleczny et al. ............ 345/173 |
| 2010/0156843 | A1 | 6/2010 | Paleczny et al. |
| 2010/0171715 | A1 * | 7/2010 | Peterson et al. ............ 345/173 |
| 2010/0182135 | A1 | 7/2010 | Moosavi |
| 2010/0253641 | A1 * | 10/2010 | Swedin ............. G02F 1/13338 345/173 |
| 2011/0141052 | A1 * | 6/2011 | Bernstein ............. G06F 3/016 345/174 |
| 2012/0206248 | A1 * | 8/2012 | Biggs .................. G06F 3/016 340/407.2 |
| 2012/0229424 | A1 * | 9/2012 | Behles ................ G06F 1/1601 345/177 |
| 2014/0145836 | A1 * | 5/2014 | Tossavainen et al. ..... 340/407.2 |

FOREIGN PATENT DOCUMENTS

| | | | |
|---|---|---|---|
| CN | 101674505 A | 3/2010 | |
| EP | 0988772 B1 | 11/2001 | |
| EP | 0965245 B1 | 1/2003 | |
| EP | 1322135 A2 | 6/2003 | |
| EP | 1544720 A1 * | 6/2005 | ............ G06F 3/033 |
| EP | 1617703 A2 | 1/2006 | |
| EP | 1912469 A1 | 4/2008 | |
| EP | 2202619 A1 | 6/2010 | |
| EP | 2202619 | 12/2013 | |
| JP | 2007-300578 A | 11/2007 | |
| KR | 20258353 | 12/2001 | |
| KR | 1020100074005 | 7/2010 | |
| RU | 2363991 C2 | 8/2009 | |
| WO | 2006/038176 A1 | 4/2006 | |
| WO | 2009/017278 A1 | 2/2009 | |
| WO | WO 2009067708 A1 * | 5/2009 | ............ G06F 3/01 |
| WO | 2010080917 A1 | 7/2010 | |
| WO | 2010085575 A1 | 7/2010 | |

OTHER PUBLICATIONS

Office Action received for related Korean Application No. 20137007120, dated Jan. 20, 2014, 7 pages.
International Search Report and Written Opinion received in corresponding Patent Cooperation Treaty Application No. PCT/IB2010/053783. dated Apr. 27, 2011.12 pages.
Office action received for corresponding Canadian Patent Application No. 2808716, dated Sep. 29, 2014, 2 pages.
"Portable AV Casio, 2.5 LCD with Integrated Speaker" translation provided from tech Japan downloaded on Mar. 4, 2010. Original document downloaded from http://dc.watch.impress.co.jp/cda/other/2005/09/29/2393.html and http://www.casio.co.jp/release/2005/speaker_module.html.
Office action received for corresponding Russian Patent Application No. 2013112149, dated Jan. 29, 2015, 4 pages of office action and 2 pages of office action translation Available.
Office action received for corresponding Chinese Patent Application No. 201080069446.X, dated Apr. 3, 2015, 7 pages of office action and 3 pages of office action translation Available.

* cited by examiner

APPARATUS AND METHOD FOR PROVIDING HAPTIC AND AUDIO FEEDBACK IN A TOUCH SENSITIVE USER INTERFACE

RELATED APPLICATION

This application was originally filed as PCT Application No. PCT/IB2010/053783 filed Aug. 23, 2010.

FIELD OF THE APPLICATION

The present invention relates to a display apparatus providing speaker functionality. The invention further relates to, but is not limited to, display apparatus providing speaker functionality for use in mobile devices.

BACKGROUND OF THE APPLICATION

Many portable devices, for example mobile telephones, are equipped with a display such as a glass or plastic display window for providing information to the user. Furthermore such display windows are now commonly used as touch sensitive inputs. The use of a touch sensitive input with the display has the advantage over a mechanical keypad in that the display may be configured to show a range of different inputs depending on the operating mode of the device. For example, in a first mode of operation the display may be enabled to enter a phone number by displaying a simple numeric keypad arrangement and in a second mode the display may be enabled for text input by displaying an alphanumeric display configuration such as a simulated Qwerty keyboard display arrangement.

However such touchscreen inputs have a disadvantage with respect to mechanical keys in that the user does not experience the usual expected click or mechanical switch feedback to indicate that an input has been detected.

To attempt to overcome this some equipment has been provided with a mechanical or audible simulation of a key press.

This feedback is known as haptic feedback when felt. Some touch screen devices have been equipped with device haptic feedback, in other words an ordinary vibration such as produced by the speaker within the device is used to make the whole device shake (and also provide an audio cue of the key press) as the user touches the screen and is detected. In other devices an eccentric mass is used to vibrate the devices when the device detects that a user has touched the screen. These device-haptic devices however are themselves problematic as they require significant current to operate in order to generate significant feedback force. This is generally because the construction of the device often requires that the front window is firmly located or fixed to the surrounding frame or connected in such a way to significantly damp the force generated by the actuator before it is applied.

For example a front window part of the display, touch interface and foam gasket can be firmly or rigidly connected to the frame by a clip which is fixed by adhesive to the frame. Similarly the front window part of the display and touch interface can be located with respect to the case by the foam gasket and clip. In order to prevent dust and other material from entering the delicate internal circuitry and mechanical parts of the device the foam gasket can be arranged to seal any gap between the case and the front window/touch sensor. These foam gaskets have the effect of assisting the rigid locating of the sensor and front window (especially under pressure) and can require significant current to be applied to the actuator in order to generate a feedback force detectable by the user. The foam gaskets are furthermore very sensitive in mechanical tolerances and during compression create an additional force which works against the actuator feedback force.

Furthermore such devices typically also use electro-acoustic transducers to produce audio for earpiece and integrated hands free (IHF) operations as well as for alert tones. The moving coil dynamic speaker configuration used is typically relatively large in relation to the volume within the device and require specific signal processing considerations in order that the acoustic frequency response is acceptable. Furthermore moving coil transducers can attract contaminants such as small iron particles from within the internal volume of the device and also through ports provided to enable acoustic wave transmission from the speaker to the external environment. These contaminants can cause distortion and faults within the speakers significantly reducing the lifetime of the device.

This application proceeds from the consideration that the provision of a flexible membrane connecting a display to the cover or main body of the device and capable of transferring the force provided by an actuator to the user by flexing and not significantly damping the force may provide both the physical and mechanical support for the display without unduly limiting the action of the display in producing tactile or haptic feedback and audio speaker functionality.

It is an aim of at least some embodiments of the invention to address one or more of these problems.

STATEMENT OF THE APPLICATION

According to an aspect, there is provided an apparatus comprising: a first part configured to form at least part of the case of the apparatus; a second part configured to form at least part of the display for the apparatus; a flexible membrane configured to couple at a first area of contact the first part and at a second area of contact the second part; and an actuator coupled to the second part and configured to apply a force to the second part to generate a substantially translational displacement of the second part.

The first part may comprise: a body part; and a frame part, wherein the flexible membrane first area of contact is configured to be attached between the body part and the frame part.

The second part may comprise: a front window layer; at least one display layer; and at least one touch interface layer.

The flexible membrane second area of contact may be configured to be attached by at least one of: between two of the front window layer, at least one display layer, and at least one touch interface layer; between two of the display layers; and between two of the touch interface layers.

The flexible membrane may comprise at least part of: one of the display layers and one of the touch interface layers.

The flexible membrane may comprise a suspension ring configured to be located within a recess of the first part, wherein the suspension ring and recess form the first area of contact.

The actuator may be configured to be further coupled to the first part by a fixed coupling.

The actuator may be at least one of: a piezoelectric actuator; a dynamic eccentric mass actuator; a moving coil actuator; and a moving magnet actuator.

At least one of the flexible membrane and second part may be configured to generate audio waves in response to the force.

The flexible membrane may comprise at least one of: an elastomer; a silicone foil; a polyethylene terephthalate (PET) polyester film; and a polycarbonate film.

The flexible membrane may have a thickness substantially in the range from 0.01 mm to 1 mm.

The flexible membrane may be coupled to at least one of the first part and the second part by a layer of optically clear adhesive.

The apparatus may further comprise a damper coupled between the actuator and second part to convert an actuator bending moment to the second part substantially translational displacement.

According to a second aspect there is provided a method of operating an apparatus comprising a first part configured to form at least part of the case of the apparatus and a second part configured to form at least part of the display for the apparatus by: coupling the first part to the second part by a flexible membrane attached at a first area of contact to the first part and at a second area of contact to the second part and coupling an actuator to the second part to apply a force to the second part to generate a substantially translational displacement of the second part.

The first part may comprise a body part, and a frame part, wherein coupling the flexible membrane first area of contact may comprise coupling the flexible membrane between the body part and the frame part.

The second part may comprise a front window layer, at least one display layer, and at least one touch interface layer and coupling the flexible membrane second area of contact may comprise coupling the flexible membrane in at least one of the following ways: between two of the front window layer, at least one display layer, and at least one touch interface layer; between two of the display layers; and between two of the touch interface layers.

The method may further comprise generating audio waves in response to the force.

The method may further comprise coupling the flexible membrane to at least one of the first part and the second part by a layer of optically clear adhesive.

Coupling an actuator to the second part to apply a force to the second part to generate a substantially translational displacement of the second part may comprise converting a bending moment generated by the actuator into the substantially translational displacement.

The method may further comprise coupling the actuator to the first part by a fixed coupling.

According to a third aspect there is provided there is provided an apparatus comprising: a casing means; a display means; a flexible coupling means for coupling the first part to the second part flexibly; and actuator means coupled to the second part and configured to apply a force to the display means to generate a substantially translational displacement of the display means.

The casing means may comprise: a body part; and a frame part, wherein the flexible membrane first area of contact is configured to be attached between the body part and the frame part.

The display means may comprise: a front window layer; at least one display layer; and at least one touch interface layer.

The coupling means may be configured to be coupled to the display means by at least one of: between two of the front window layer, at least one display layer, and at least one touch interface layer; between two of the display layers; and between two of the touch interface layers.

The coupling means may comprise at least part of: one of the display layers and one of the touch interface layers.

The coupling means may comprise a suspension ring configured to be located within a recess of the casing means, wherein the suspension ring and recess form a fixed coupling.

The actuator means may be configured to be further coupled to the first part by a fixed coupling.

The actuator means may be at least one of: a piezoelectric actuator; a dynamic eccentric mass actuator; a moving coil actuator; and a moving magnet actuator.

At least one of the coupling means and display means may be configured to generate audio waves in response to the force.

The coupling means may comprise a flexible membrane of at least one of: an elastomer; a silicone foil; a polyethylene terephthalate (PET) polyester film; and a polycarbonate film.

The flexible membrane may have a thickness substantially in the range from 0.01 mm to 1 mm.

The flexible membrane may be coupled to at least one of the first part and the second part by a layer of optically clear adhesive.

The apparatus may further comprise a damper means coupled between the actuator means and display means to convert an actuator bending moment to the second part substantially translational displacement.

SUMMARY OF FIGURES

For better understanding of the present invention, reference will now be made by way of example to the accompanying drawings in which.

DESCRIPTION OF EXAMPLE EMBODIMENTS

The application describes apparatus and methods of construction for apparatus suitable for generating touch screen devices capable of creating a more interactive user experience and audio generation through the screen. Thus as described hereafter in embodiments of the application, the use of a flexible membrane for connecting the display with the cover or case enables the display to be driven substantially in a linear manner. Driving the display in a linear rather than bending manner greatly enhances the user haptic experience and generates acoustic waves suitable for earpiece or speaker replacement. The construction of such a display module and some examples of its implementation within apparatus is described in further detail hereafter.

Figure 1:
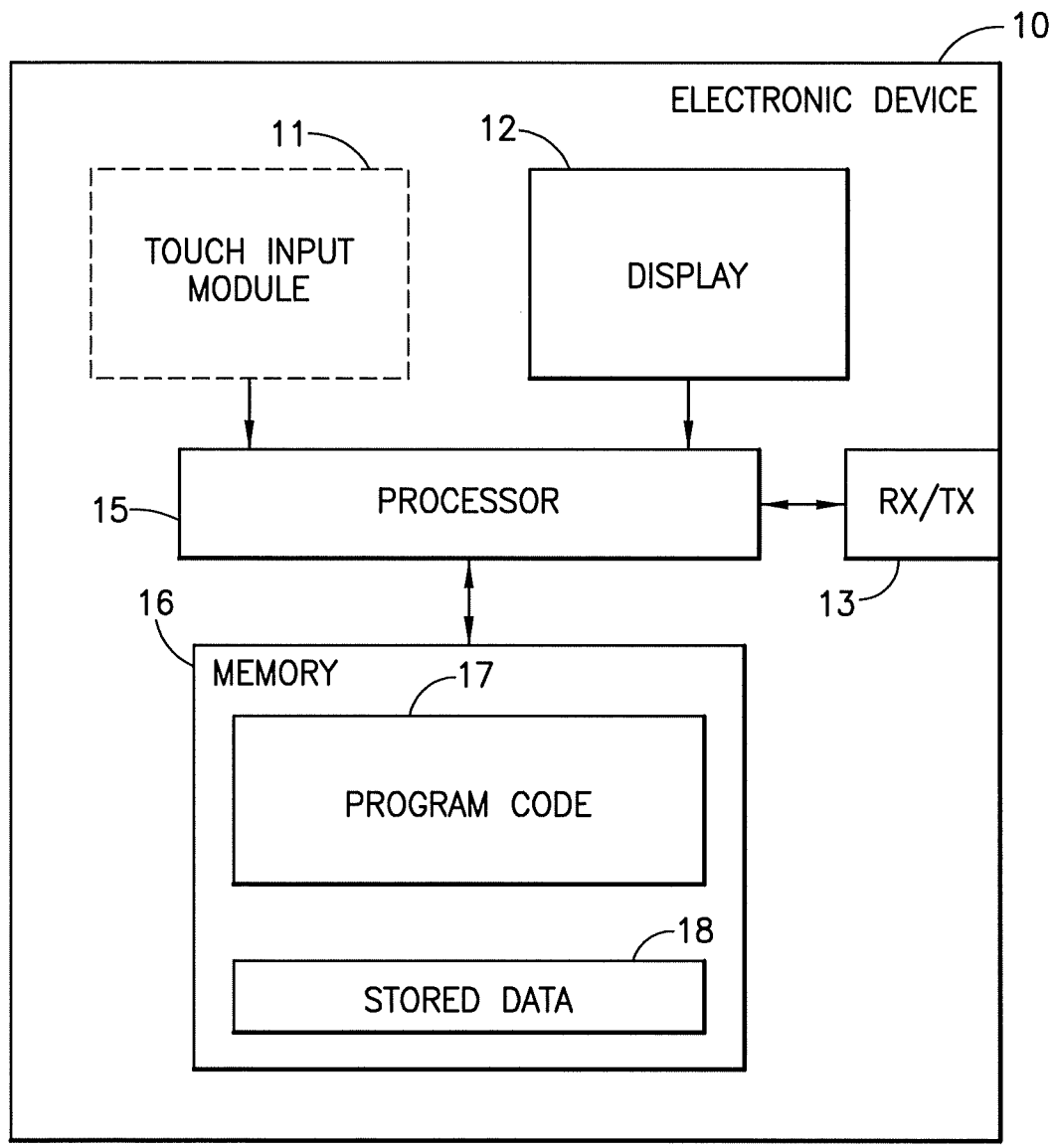
FIG. 1 shows schematically an apparatus suitable for employing embodiments of the application.

With respect to FIG. 1 a schematic block diagram of an example electronic device 10 or apparatus on which embodiments of the application can be implemented. The apparatus 10 is such embodiments configured to provide improved haptic feedback and audio generation.

The apparatus 10 is in some embodiments a mobile terminal, mobile phone or user equipment for operation in a wireless communication system. In other embodiments, the electronic device is any suitable electronic device configured to provide a image display, such as for example a digital camera, a portable audio player (mp3 player), a portable video player (mp4 player). In other embodiments the apparatus can be any suitable electronic device with touch interface (which may or may not display information) such as a touch-screen or touch-pad configured to provide feedback when the touch-screen or touch-pad is touched. For example in some embodiments the touch-pad can be a touch-sensitive keypad which can in some embodiments have no markings on it and in other embodiments have physical markings or designations on the front window. An example of such a touch sensor can be a touch sensitive user interface to replace keypads in automatic teller machines (ATM) that does not require a screen mounted underneath the front window projecting a display. The user can in such embodiments be notified of where to touch by a physical identifier—such as a raised profile, or a printed layer which can be illuminated by a light guide.

The apparatus 10 comprises a touch input module or user interface 11, which is linked to a processor 15. The processor 15 is further linked to a display 12. The processor 15 is further linked to a transceiver (TX/RX) 13 and to a memory 16.

In some embodiments, the touch input module 11 and/or the display 12 are separate or separable from the electronic device and the processor receives signals from the touch input module 11 and/or transmits and signals to the display 12 via the transceiver 13 or another suitable interface. Furthermore in some embodiments the touch input module 11 and display 12 are parts of the same component. In such embodiments the touch interface module 11 and display 12 can be referred to as the display part or touch display part.

The processor 15 can in some embodiments be configured to execute various program codes. The implemented program codes, in some embodiments can comprise such routines as touch capture digital processing or configuration code where the touch input module inputs are detected and processed, display image processing and image interaction code where the data to be passed to generate the display images is generated for example based on the detection of the input, or actuator processing generating an actuator signal for driving an actuator. The implemented program codes can in some embodiments be stored for example in the memory 16 and specifically within a program code section 17 of the memory 16 for retrieval by the processor 15 whenever needed. The memory 15 in some embodiments can further provide a section 18 for storing data, for example data that has been processed in accordance with the application, for example display information data.

The touch input module 11 can in some embodiments implement any suitable touch screen interface technology. For example in some embodiments the touch screen interface can comprise a capacitive sensor configured to be sensitive to the presence of a finger above or on the touch screen interface. The capacitive sensor can comprise an insulator (for example glass or plastic), coated with a transparent conductor (for example indium tin oxide—ITO). As the human body is also a conductor, touching the surface of the screen results in a distortion of the local electrostatic field, measurable as a change in capacitance. Any suitable technology may be used to determine the location of the touch. The location can be passed to the processor which may calculate how the user's touch relates to the device. The insulator protects the conductive layer from dirt, dust or residue from the finger.

In some other embodiments the touch input module can be a resistive sensor comprising of several layers of which two are thin, metallic, electrically conductive layers separated by a narrow gap. When an object, such as a finger, presses down on a point on the panel's outer surface the two metallic layers become connected at that point: the panel then behaves as a pair of voltage dividers with connected outputs. This physical change therefore causes a change in the electrical current which is registered as a touch event and sent to the processor for processing.

In some other embodiments the touch input module can further determine a touch using technologies such as visual detection for example a camera either located below the surface or over the surface detecting the position of the finger or touching object, projected capacitance detection, infra-red detection, surface acoustic wave detection, dispersive signal technology, and acoustic pulse recognition.

The apparatus 10 can in some embodiments be capable of implementing the processing techniques at least partially in hardware, in other words the processing carried out by the processor 15 may be implemented at least partially in hardware without the need of software or firmware to operate the hardware.

The transceiver 13 in some embodiments enables communication with other electronic devices, for example in some embodiments via a wireless communication network.

The display 12 may comprise any suitable display technology. For example the display element can be located below the touch input module and project an image through the touch input module to be viewed by the user. The display 12 can employ any suitable display technology such as liquid crystal display (LCD), light emitting diodes (LED), organic light emitting diodes (OLED), plasma display cells, Field emission display (FED), surface-conduction electron-emitter displays (SED), and Electophoretic displays (also known as electronic paper, e-paper or electronic ink displays). In some embodiments the display 12 employs one of the display technologies projected using a light guide to the display window. As described herein the display 12 in some embodiments can be implemented as a physical fixed display. For example the display can be a physical decal or transfer on the front window. In some other embodiments the display can be located on a physically different level from the rest of the surface, such a raised or recessed marking on the front window. In some other embodiments the display can be a printed layer illuminated by a light guide under the front window.

Figure 2:
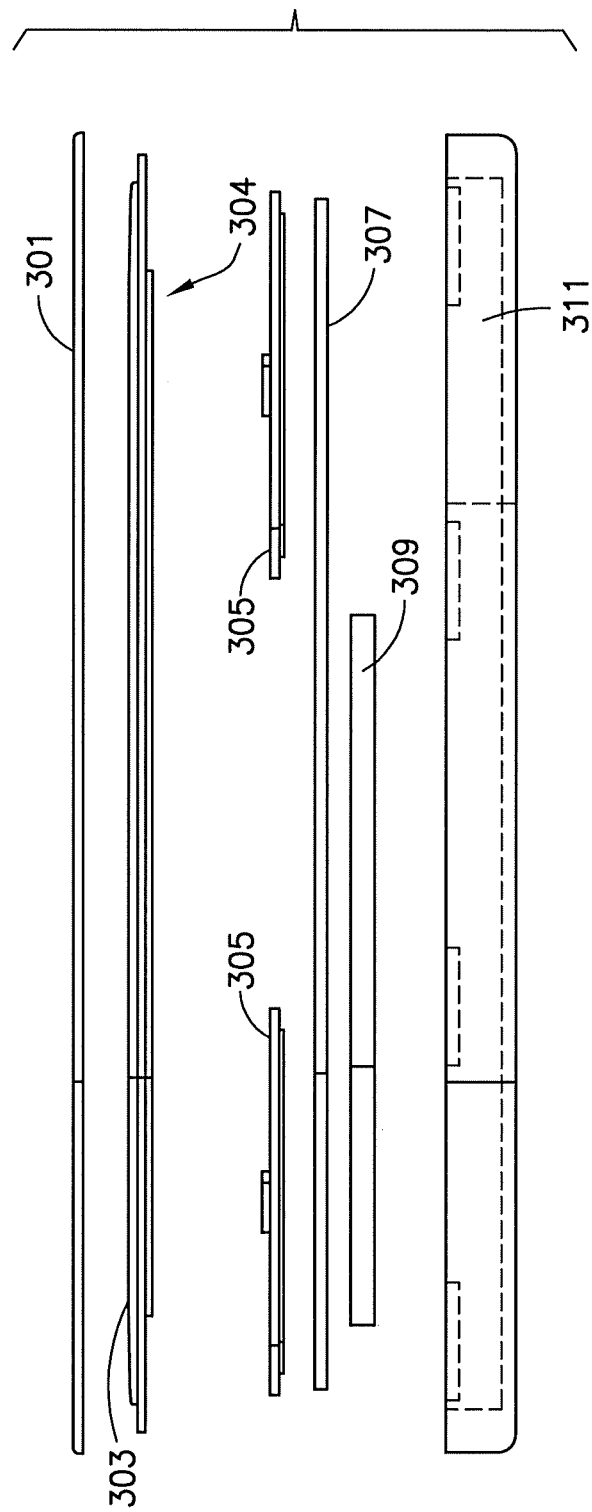
FIG. 2 shows a schematic exploded elevation view of example topology for apparatus according to some embodiments.
Figure 3:
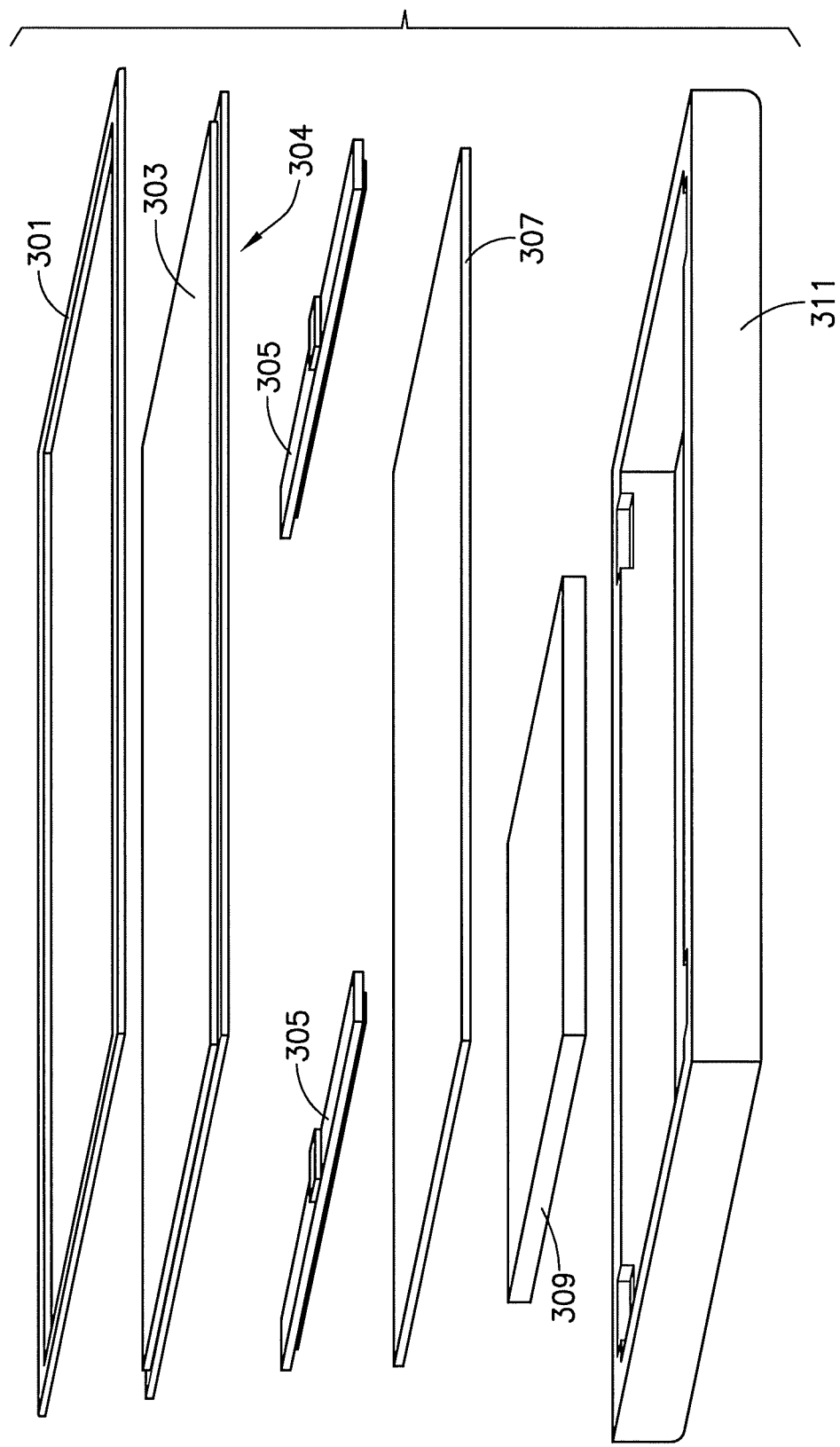
FIG. 3 shows a schematic exploded orthogonal projection view of the example topology for apparatus according to some embodiments in further detail.

With respect to FIGS. 2 and 3 exploded views of an example apparatus or device according to some embodiments of the application are shown. Furthermore with respect to FIG. 4 an assembled view of the example apparatus is shown. The apparatus 10 can comprise a body part 311 or outer frame which can be constructed from any suitable material and is configured to provide a structure to which other components may be coupled and/or may protect other components from damage. In some embodiments the body part 311 can comprise an inner surface to which internal components are located and an outer surface to which external components are located and which is exposed to the elements. In some embodiments the junction between the inner surface and the outer surface is connected via a filet or chamfer to smooth the junction. In such embodiments by smoothing the junction there is less chance of damaging other components.

The apparatus 10 in some embodiments comprises a battery 309. The battery 309 can be any suitable electrical power generating means and can employ any suitable electrical charge storage or generating technology, for example but not exclusively lithium polymer cells, fuel cell, solar cell or a combination of suitable technologies. In some embodiments the battery 309 is rechargeable or refillable and is connected via a port in the body part 311 to be able to receive a recharging or refilling coupling, for example a recharger plug to couple to a recharging socket for supplying power to recharge the battery 309. In some embodiments the battery 309 is configured to be located within the body part 311. For example the body part 311 can in some embodiments employs moulding tabs or other locating means on the inner surface to fix or locate the battery in position.

In some embodiments the apparatus 10 further employs a printed wiring board (PWB) 307. The printed wiring board 307 is configured to provide a suitable structure for locating electrical components. For example in some embodiments the processor 15, transceiver 13 and memory 16 shown in FIG. 1 can be located on the printed wiring board. In some embodiments there can be employed more than one printed wiring board 307 layer. Furthermore in some embodiments the printed wiring board 307 can be replaced by a printed circuit board (PCB) or surface mounted board suitable for locating surface mounted electrical components on it. In some embodiments the printed wiring board 307 is configured to be coupled to the battery 309 whereby the battery 309 is configured to supply the printed wiring board 307 with power to operate the electrical components located on it. In the example shown in FIGS. 2 to 4 the printed wiring board is located over the battery and within the body part 311. It would be understood that in some embodiments the body part 311 can employ moulding tabs or other locating means on the inner surface to fix or locate the printed wiring board in position.

The apparatus 10 further comprises at least one piezoelectric actuator 305. In the example shown in FIG. 2 the apparatus employs a first piezoelectric actuator 305 located towards one end of body part 311 and a second piezoelectric actuator 305 located at the opposite end of the body part 311. The piezoelectric actuator 305 is in some embodiments coupled to receive power from the battery 309 via the printed wiring board 307 and to produce a physical moment or force in response to a current passed through the piezoelectric actuator 305.

Figure 4:
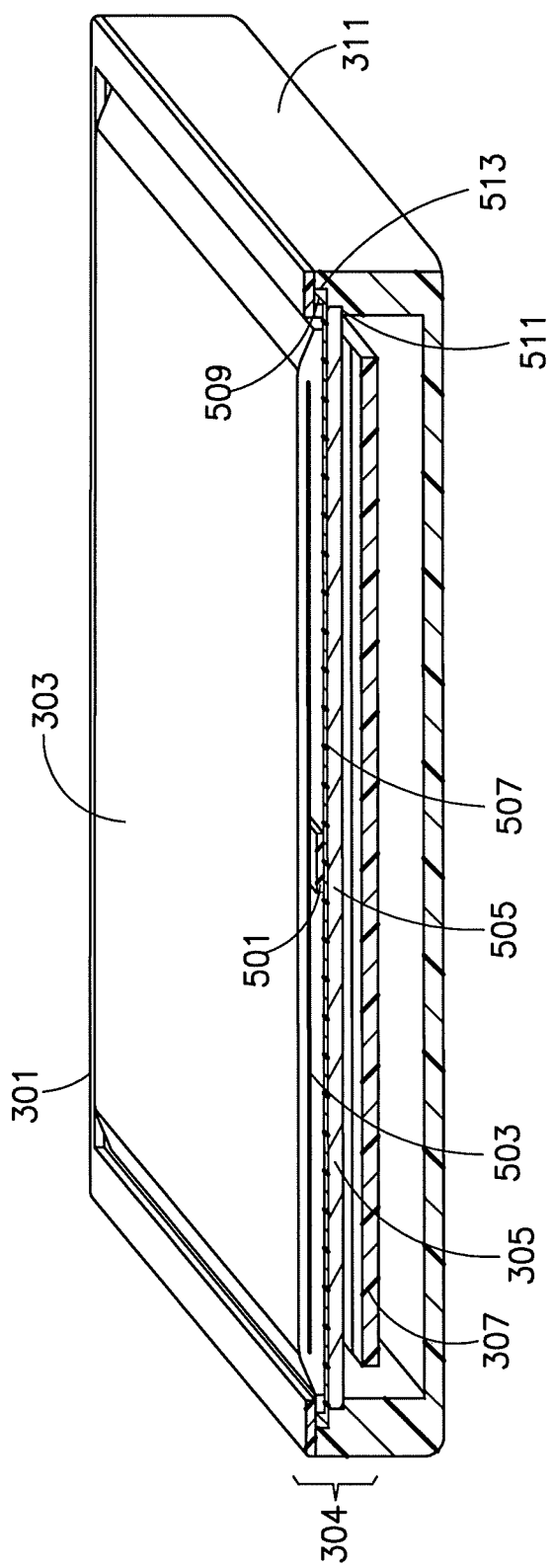
FIG. 4 shows a schematic orthogonal projection sectioned view of the example topology for apparatus according to some embodiments.

Each piezoelectric actuator 305 furthermore as can be seen in FIG. 4 can in some embodiments be located within the case body by an inner recess 511 which is configured to receive the piezoelectric actuator 305. The inner recess 511 is configured to locate either end of the piezoelectric actuator 305 in position such that in some embodiments when the piezoelectric actuator 305 is operated the ends of the piezoelectric actuator are fixed nodes. Furthermore as shown in FIG. 4 the piezoelectric actuator 305 in some embodiments is suspended at each end by the body part 311 recess 511 such that when a current is applied the piezoelectric actuator 305 flexes and can 'push' against the case body thus producing a motion in and away from the direction of the display. In other words where the display is considered to be in a plane designated the X-Y axis the actuations of the piezoelectric actuator to actuate or produce a force in a "Z" dimension or direction. In some embodiments there is configured to be a suitable air gap between the piezoelectric actuator 305 and the printed wiring board 307 in order to prevent 'clipping' of the actuation of the piezoelectric actuator 305.

Although the following examples are described with respect to the use of a piezoelectric actuator 305 it would be understood that any suitable actuator capable of producing a translational force to a display could be implemented in some further embodiments. For example in some other embodiments an eccentric mass can be employed to produce a force which may be passed. In further examples a moving coil or moving magnet actuator can generate the force.

In some further embodiments the display can directly experience the force which is transmitted from the piezoelectric actuator to the display assembly 304 in such a manner to permit a planar motion of the display assembly. For example in some embodiments the piezoelectric actuator is shaped with a suitable thickening to in a central portion to provide a projection through which force can be passed to a display.

In some embodiments the piezoelectric actuator 305 is further coupled via a conductive soft surface mounted technology (SMT) pad 219 to the printed wiring board (PWB) which provides an electrical coupling between the piezoelectric actuator 305 and the printed wiring board 307.

The apparatus 10 can in some embodiments comprise a rubber force contact 501. The rubber force contact is configured to be located on or be in contact with the piezoelectric actuator 305 approximately half way along the length of the actuator and translate the bending motion of the piezoelectric actuator to produce a linear or planar movement of a display assembly. In such embodiments the rubber force contact 501 can be manufactured from any suitable material, such as natural rubber, synthetic rubber, or plastic being capable of transmission of force in a direction. In some embodiments the rubber force contact 501 can be designed to provide a degree of buffering of force or 'damping' between the piezoelectric actuator 305 and the display so to prevent the display experiencing shock and/or damage when the piezoelectric actuator 305 is driven. The rubber force contact 501 or other force damping means furthermore can in some embodiments by damping the force furthermore reduce any bending moment experienced by the display.

The apparatus 10 can in some embodiments further comprise a display 304 or display assembly. The display 304 can comprise any suitable display technology as described herein.

In some embodiments the display 304 is configured to employ a flexible membrane or plate suspension membrane 507. The example shown in FIG. 4 shows the flexible membrane being located in contact or substantially in contact with the rubber force contact and suspended at least partially at a periphery of the flexible membrane 507 between the frame part 301 and body part 311. In some embodiments as shown in FIG. 4 the flexible membrane 507 is sandwiched at the periphery of the membrane between the body part 311 and the frame part 301 and located by a suspension ring 509 attached to the flexible membrane 507 and located within a suspension ring recess 513 formed on the inner surface of the body part 311. In some embodiments the suspension ring 509 can be formed as a substantially thickened section of the flexible membrane 507.

In some embodiments the inner surface of the body part 311 can be attached to the flexible membrane 507 via an adhesive layer. In some embodiments the adhesive layer extends beyond the static area of contact between the inner surface of the body part 311 and the flexible membrane 507 in order to provide additional protection at any dynamic area of contact between the inner surface of the body part 311 and the flexible membrane 507. The flexible membrane 507 in some embodiments may be manufactured from an elastomer. The elastomer in some embodiments may be any suitable film or foil. For example the suitable film or foil may be in various embodiments a polyethylene terephthalate (PET) film, a polycarbonate (PC) foil, or a silicone foil.

The flexible membrane 507 in such embodiments can furthermore be attached via a further adhesive layer to a surface of the frame part 301. The body part 311 and the frame part 301 thus in these embodiments locates at least some of the flexible membrane 211. In some embodiments the junction between the surfaces of body part 311 and the frame part 301 are configured with a fillet or chamfer to smooth the junction for a similar reason as above for protecting the membrane while the membrane is dynamic. Similarly in some embodiments the further adhesive layer may extend beyond the static area of contact to provide additional protection at any dynamic area of contact.

The flexible membrane 507 can be constructed out of polyethylene terephthalate (PET) polyester film. In some embodiments the film can be biaxially oriented polyethylene terephthalate which may be used because of its high tensile strength, chemical and dimensional stability, transparency and also electrical insulation properties. The PET flexible membrane layer can in some embodiments be approximately 0.01 to approximately 1 mm thick as this thickness has been shown to provide both the flexibility in response to forces from the user and from the actuator but also has sufficient tensile strength not to break under such forces. The PET flexible membrane 211 can be constructed by any suitable means. For example the PET layer may be constructed by extrusion onto a chill roll which quenches it into an amorphous state. The PET flexible membrane layer furthermore in some embodiments can be constructed in such a way that the crystallites grow rapidly but reach the boundary of neighbouring crystallites and remain smaller than the wavelength of visible light and thus produce a film having excellent clarity.

In some embodiments the display assembly can further comprise a display element 505. The display element 505 can in some embodiments comprise a static display array located beneath the front window 303 and projected up to the user through the front window 303.

The graphic layer can comprise any suitable material for blocking projected light. In such embodiments the graphic layer can be approximately 0.05 to approximately 0.07 mm thick. Furthermore in some embodiments the graphic layer can be printed directly onto the underside of the front window 303. In some other embodiments, for example where the display element 505 is a dynamic display, the graphic layer can comprise any suitable material for permitting the controllable and selectable projection of light—for example a liquid crystal display element and colour filter layer, E-ink etc.

The graphic layer can in some embodiments be coupled to the flexible membrane 507 via an optically clear adhesive (OCA) layer. The optically clear adhesive layer can be approximately 0.025 to approximately 0.05 mm thick and can be the same material as other OCA layers.

The static display array in some embodiments can also comprise a graphic layer which may be connected to the front window 303 by a first optically clear adhesive (OCA) layer. The first optically clear adhesive layer may be approximately 0.025 to approximately 0.05 mm thick and be any suitable OCA material.

The display assembly 304 in some embodiments further comprises a touch sensor 503 for example a capacitive touch sensor located over the display element 503.

The capacitive touch sensor can in some embodiments comprise a series of layers. The layers in the capacitive touch sensor can comprise at least one Indium Tin Oxide on PET layer, and a protective hard coated PET layer. Each layer can in some embodiments be fixed to the neighbouring layers by the use of an optically clear adhesive to form a sandwich of layers.

The display element 505 for example can in some embodiments be connected via a second layer of optically clear adhesive (OCA) to a first layer of indium tin oxide (ITO) on PET. The second layer of OCA can in some embodiments be approximately 0.025 to approximately 0.05 mm thick.

The first layer of indium tin oxide (ITO) on PET in some embodiments is the first of the capacitive touch interface 203 layers. In other words the first ITO on PET layer provides a first layer capable of detecting the capacitive coupling produced by the user's finger when it touches the front window 303. The first layer of ITO on PET can in some embodiments be approximately 0.05 to 0.2 mm thick.

The first layer of ITO on PET layer can be connected to a second ITO on PET layer via a third layer of optically clear adhesive (OCA). The third layer of OCA can in some embodiments be approximately 0.025 to approximately 0.05 millimetres thick.

The second layer of ITO on PET can in some embodiments be a further layer capable of detecting the capacitive coupling produced by the user's finger when it touches the front window 303. The second ITO on PET layer can in some embodiments be approximately 0.05 to approximately 0.2 mm thick.

Although the capacitive touch interface layers have been described as being ITO on PET layers it would be understood that the capacitive touch interface layers may comprise any suitable material, for example ITO on glass.

In some embodiments the display comprises a protective or front window 303.

The front window 303 can in some embodiments be manufactured from glass. In some embodiments the glass may be coated with optical (to reduce glare) or oleophobic (to resist fingerprints) films to enhance the characteristics of the front window. The front window 303 can in some embodiments overlay the other display components and is configured to protect the other display components. In such embodiments, the front window 303 made from glass can be approximately 0.5 to approximately 1.2 millimetres thick.

In some other embodiments the front window 303 can be manufactured from a plastic or other protective screen material suitable for both enabling the other components from performing their tasks and protecting the other components from physical or other damage. For example the front window 303 can in some embodiments provide a dielectric material between a capacitive touch interface touch sensor 503 and the user's finger, while the front window 303 is also sufficiently transparent to permit any display elements under the window being seen by the user.

The front window 303 for example as shown in FIG. 4 covers the touch sensor 503 and in some embodiments can be connected by a further layer of optically clear adhesive.

Although the above example is shown where the touch sensor 501 covers the display element 503 which lies on the flexible membrane layer 507 it would be understood that the layers could be reordered into any suitable arrangement.

Furthermore in some embodiments the display element 505 can employ further layers such as a light guide layer for projecting a light towards the user. The light guide layer can be formed from any suitable material for conveying a light from a light source (not shown) and projecting the light to the user. In some embodiments the light guide can diffuse the light to produce a more pleasing display image.

Furthermore in some embodiments the display element can employ a hard coated PET layer which can provide both support for and protect the display and/or flexible membrane from physical damage.

In some other embodiments the display element 505 is not a filtering display where a uniform (or generally uniform) light source is filtered to produce an image but may be a generated display such as an light emitting diode (LED) or active matrix organic light emitting diode (AMOLED) display.

In some embodiments the flexible membrane layer 507 can be manufactured as one of the other above described PET films. For example the flexible PET membrane may be an extension of one of the ITO on PET layers extended beyond the shape of the touch sensor to enable it to be fixed to the case. In such embodiments the ITO on PET layer may thus be both the flexible membrane and be sensitive to capacitive changes.

Although the above examples feature the flexible membrane as a PET layer it would be understood that any suitable material may be employed. For example in some embodiments the flexible membrane may be formed by a polycarbonate layer. In such embodiments a thickness of approximately 0.1 mm polycarbonate may provide sufficient tensile strength and flexibility.

The flexible membrane 507 can be in some embodiments considered to be a laminar film or layer which is located at least at some contact area to an inner part comprising at least one of the window, touch sensor and display element and at least at some other contact area to the outer part comprising at least one of the frame or body part. The flexible membrane 507 furthermore in these embodiments maintains a flexible connection between the inner part and the outer part. In other words the flexible membrane 507 is configured in these embodiments to be flexible in that it is elastic in nature such that when pressure is applied to the front window 303 the flexible membrane 507 can move or flex relative to the frame or body part and thus the inner part can move relative to the outer part.

Furthermore the flexible membrane layer 507 in such embodiments can permit without undue damping the transmission of force generated by a piezoelectric actuator 305 such as a force of 1 to 2 N to the display assembly 304 can be sensed by the user.

Furthermore the flexible membrane 507 together with the rubber force contact 501 in some embodiments can further limit the motion of the inner part relative to the outer or peripheral part. The flexible membrane 507 and the rubber force contact 501 may therefore prevent the inner part 251 from 'hovering'. Hovering is an effect experienced by a user where when the inner and outer parts can move laterally as well as vertically with respect to each other. This for example is found in systems where gaskets wear or are loose and thus produce a slipping, tipping or rolling motion of the inner part relative to the peripheral part. This effect is especially noticeable in large touch interfaces and touch screen displays. This hovering may not only be unpleasant to interact with as the button press feels broken, but may vibrate and generate a buzzing or noise which would lead the user to think that the product was faulty or sub-standard. The flexible membrane 507 in some embodiments thus may generate no or only negligible damping force on the inner part nor transmit any or only negligible force to the case through the membrane to limit any case vibration.

The flexible membrane 507 is preferably light and does not therefore produce significantly more undamped weight in addition to the mass of the suspended display assembly to be moved by the piezoelectric actuator 305. In some embodiments the elasticity or flexibility of the flexible membrane 507 is such that it enables a vertical or sheer displacement of the display assembly with respect to the body part 311/frame part 301 such that the user experiences a response similar to that of pressing a physical key or button.

In some embodiments the piezoelectric actuator 305 can be modulated in such a way that the modulation transmitted via the flexible membrane laminar to the display 304 causes the display 304 to generate audible oscillations. In other words in some embodiments the display can be used as a flat panel speaker structure where the flexible membrane 305 provides sufficient damping (but not under-damping or over-damping) in the transmission of the piezoelectric actuated vibration to the display 304.

In some further embodiments, the flexible membrane 507 is applied across the apparatus extending to thus provide a dust and moisture proof seal protecting the delicate electronic circuitry and mechanical components from water, dust, or other materials.

Furthermore the apparatus 10 comprises a frame part 301 configured to locate the display assembly 304 in relation to the body part 311 as described herein.

Figure 5:
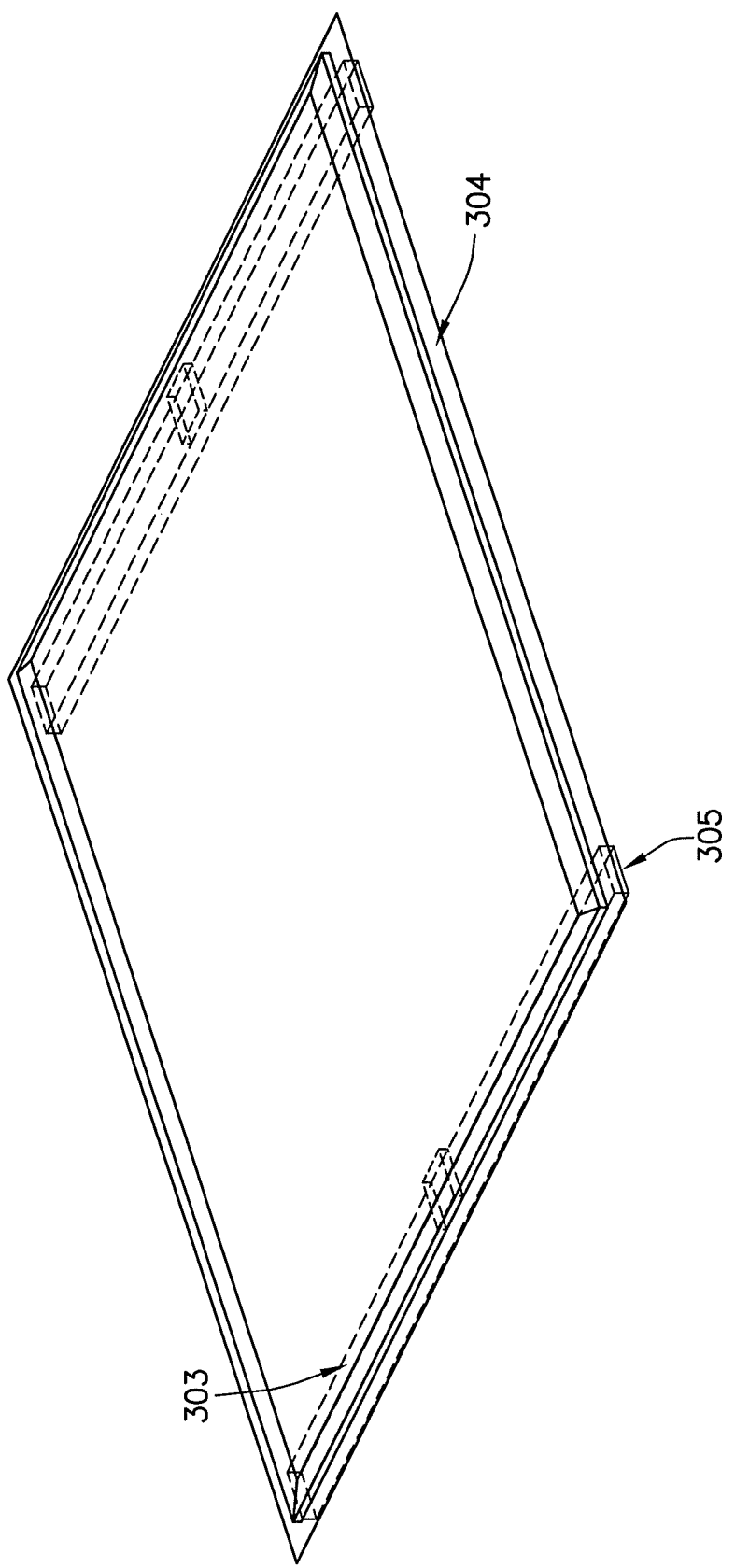
FIG. 5 shows a schematic isometric projection view of parts of the example topology in further detail.
Figure 6:
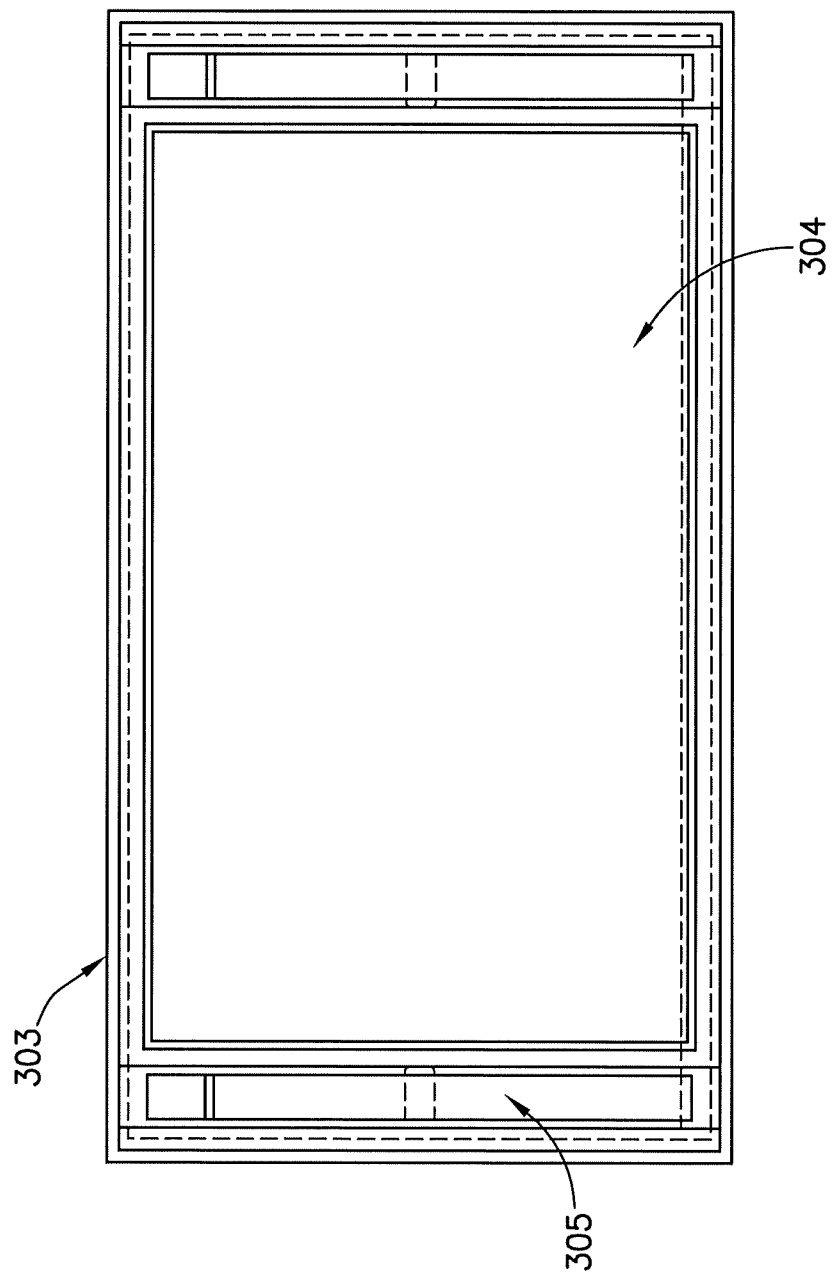
FIG. 6 shows a further schematic isometric projection view of parts of the example topology in further detail.

With respect to FIGS. 5 and 6, examples of display assemblies 304 are shown with a series of example dimensions. In the example shown in FIG. 5, the front window 303 is smaller than the display assembly 304 (which would in this example include the flexible membrane and suspension ring) such that the display assembly flexible membrane can be located between the frame part 301 and the body part 311. The example shown in FIG. 5 has a front window 303 approximately 110 mm long 54 mm wide and with an approximate thickness or depth of 0.565 mm. The front window 303 in such embodiments lies over or is in contact with the display assembly 304 which can be seen to be 2 mm longer in each direction and 0.6 mm wider in each direction. In such embodiments the piezoelectric actuator 305 are configured to be in contact with the display assembly via for example the rubber force contacts 501.

With respect to FIG. 6 the reverse side of a further example display module is shown whereby the display module or assembly 304 (which in this example does not include the show the flexible membrane and suspension ring but only the display layer) is smaller than the front window 303 and the front window 303 is in contact with the piezoelectric actuator 305 therefore reducing the direct stresses on the display assembly 304. The example shown in FIG. 4 displays a display assembly 304 as being approximately 58 mm wide and 114 mm long. Furthermore the piezoelectric actuator 305 is shown and are each 55 mm long and 6 mm wide located at opposite ends of the display module whereby the centre of the long axis of each actuator is approximately located on the centre of the short axis for the display assembly 304. Furthermore the front window 303 can be seen approximately 91.2 mm long and 50.4 mm wide located centrally on the display assembly.

Figure 7:
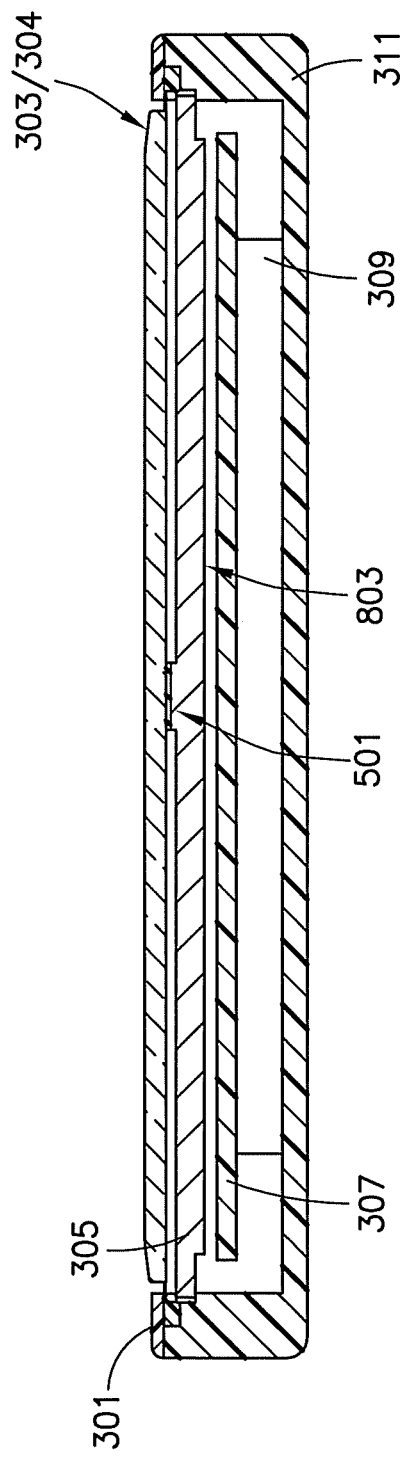
FIG. 7 shows a further schematic sectioned view of the example topology for apparatus according to some embodiments.
Figure 8:
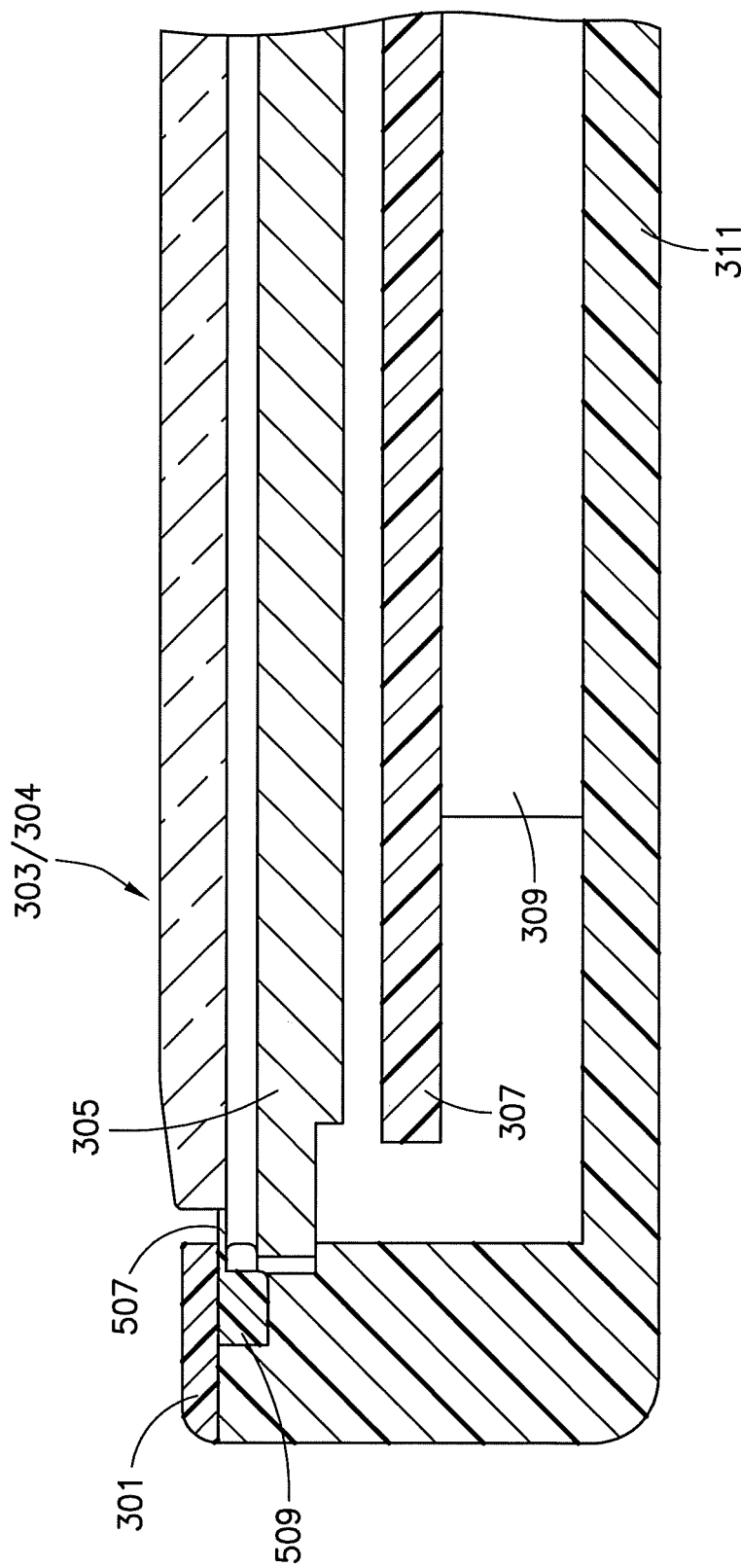
FIG. 8 shows a detail of the further schematic sectioned view of the example topology shown in FIG. 7.

With respect to FIG. 7, a sectioned view of the end of the apparatus 10 according to some embodiments where the display assembly 304 is physically larger than the front window 303 and the piezoelectric actuator 305 is coupled to the display assembly via the rubber force contact 501 is shown in further detail. With respect to FIG. 8 a detail of the sectioned view shown in FIG. 7 is shown in order to show a possible way to locate the display assembly 304 with respect to the body part 311 and the frame part 301 by the use of a suspension ring 509 component. The detail shows the suspension ring 509 held or located in a recess formed between the frame part 301 and body part 311 which at one point is narrower than the cross-section of the suspension ring 509 permitting the coupling between the suspension ring 509 and the display assembly via the flexible membrane 507.

Figure 9:
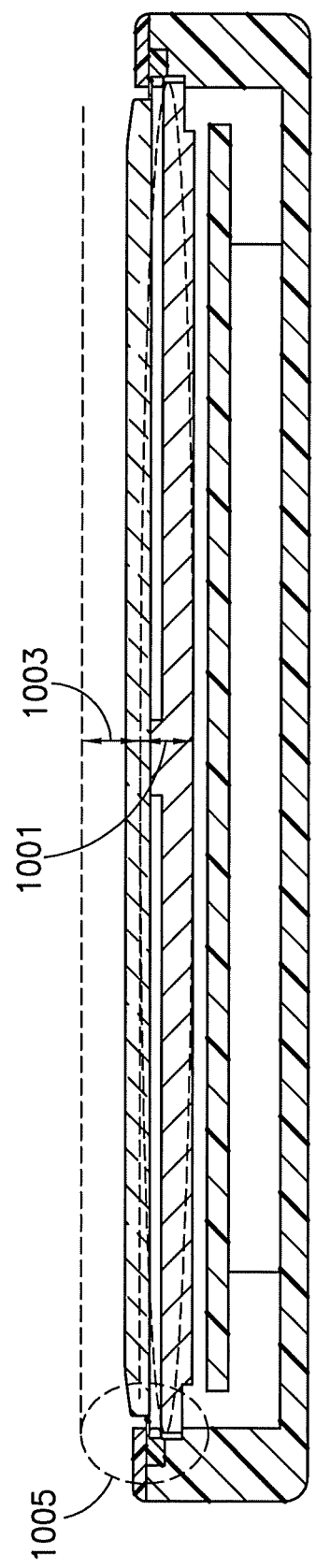
FIG. 9 shows the operation of the further schematic sectioned view of the example topology shown in FIG. 7 according to some embodiments.

With respect to FIG. 9 an example of the operation of the piezoelectric actuator 305 is shown. In FIG. 9 the piezoelectric actuator 305 is configured to vibrate 1001 in such a way that the bending moment of the piezoelectric actuator 305 transfers a force via the rubber force contact 501 to the display assembly 304 causing the display to move 1003 substantially in translational mode of displacement. The display assembly 304 as discussed herein can be configured in some embodiments to move in such a way that it is substantially a linear translation in the dimension perpendicularly into and out of the apparatus 10 (the 'z' direction as compared to the x and y directions which define the display plane) perpendicular to the membrane layer because of the relatively large degree of flexibility available at the membrane joint 1005 compared to the display assembly rigidity.

The flexible membrane 507 is configured to in some embodiments enable displacement of the display assembly 304/front window 303 in the region of 20-50 μm substantially perpendicular to the plane of the display assembly 304. In some embodiments the display assembly can be tuned to provide a beneficial audio response.

The display assembly 304 thus can produce a sufficient air displacement to generate audio signals with sufficient amplitude to implement not only earpiece operations but also to provide speaker operations such as for example integrated hands free speaker operations. For example a reference requirement for all existing integrated earpiece technology is approximately in the realm of 11 μm$^3$ or for an integrated handsfree speaker 55 μm$^3$, whereas the display shown in embodiments of the application have a 5600 μm$^2$ plate area which is multiplied by 50 μm peak-to-peak displacement to produce an air volume displacement of 280 μm$^3$. Furthermore this provides the ability to produce better haptic performance over NXT technology.

Furthermore as in some embodiments there are no magnetic parts required there are no issues concerning metal dust or other contaminants. Furthermore as the flexible membrane, frame part and body part can in some embodiments form a seal the whole system is easy to seal from moisture and dust as no sound holes are required and apparatus can be easily weather proofed. Furthermore in embodiments by using the display assembly as both display and air mass driver no internal audio transducers are required thus reducing required volumes and space and allowing thinner and more aesthetically pleasing products to be designed.

There are further improvements with regards to haptics as there is a greater evenness in feedback as the feedback is carried out over the whole display surface, furthermore the experienced feedback is greater than normal due to the said directional movement against the user when compared to an X or Y directional translational movement.

Figure 10:
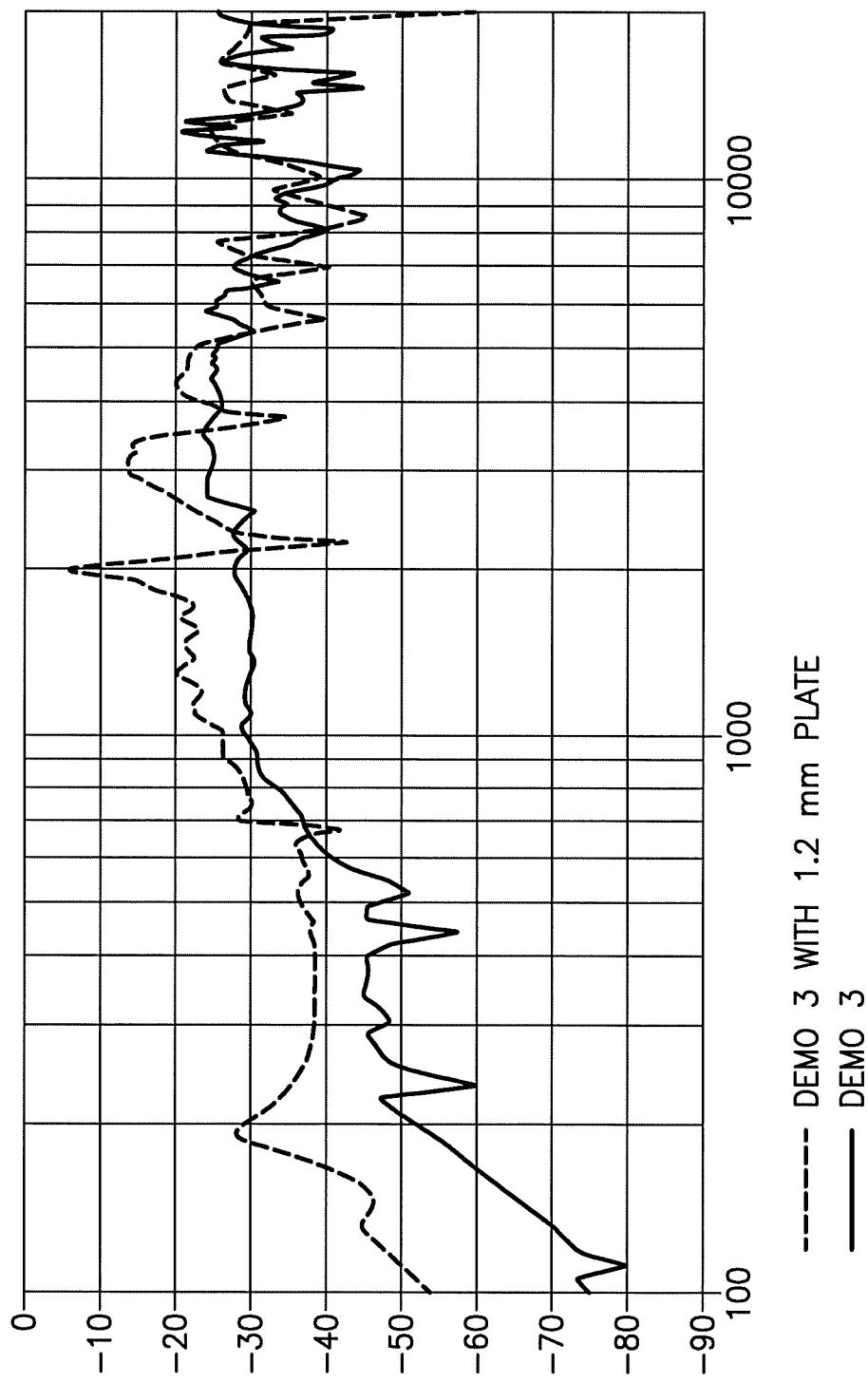
FIG. 10 shows the frequency response of some embodiments.

Furthermore there are advantages with regards to replacing the requirement for advanced haptics, earpiece audio and integrated speakers with two piezoelectric actuators and the display module. With respect to FIG. 10, a graph showing the frequency response performance of two example embodiments is shown. In FIG. 10 the example embodiments show a good low frequency performance and with an audio volume produced equivalent to many integrated speaker solutions currently in operation. Furthermore such a device does not require additional signal processing tuning as required in conventional integrated handsfree devices used in small volumes.

It shall be appreciated that the term user equipment is intended to cover any suitable type of wireless user equipment, such as mobile telephones, portable data processing devices or portable web browsers. Furthermore, it will be understood that the term acoustic sound channels is intended to cover sound outlets, channels and cavities, and that such sound channels may be formed integrally with the transducer, or as part of the mechanical integration of the transducer with the device.

In general, the design of various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The design of embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory used in the design of embodiments of the application may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be designed by various components such as integrated circuit modules.

As used in this application, the term 'circuitry' refers to all of the following:

(a) hardware-only circuit implementations (such as implementations in only analog and/or digital circuitry) and (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising:
a first part configured to form at least part of a case of the apparatus;
a second part configured to form at least one of:
a front window, and
at least one layer of a display assembly for the apparatus;
a flexible membrane coupling, at a first area of contact, the first part and, at a second area of contact, the second part; and
at least two actuators coupled to the second part and configured to actuate the second part to generate a translational planar motion displacement of the second part based at least partially upon the flexible membrane that enables the translational planar motion displacement of the second part to generate sound waves when the second part is actuated by the at least two actuators, where the at least two actuators are configured to generate the translational planar motion displacement of the second part comprising at least one of:
an entirety of the front window having the translational planar motion displacement, and
an entirety of the at least one layer of the display assembly having the translational planar motion displacement.

2. The apparatus as claimed in claim 1, wherein the first part comprises:
a body part; and/or
a frame part, and
wherein the flexible membrane first area of contact is configured to be attached to at least one of:
the body part,
the frame part, or
between the body part and the frame part.

3. The apparatus as claimed in claim 1, wherein the second part comprises at least one of:
both the at least one layer of the display assembly and the front window as a layer of the display assembly; and
at least one touch interface layer.

4. The apparatus as claimed in claim 3, wherein the flexible membrane second area of contact is coupled to at least one of the layers comprised in the second part.

5. The apparatus as claimed in claim 3, wherein the flexible membrane comprises at least part of:
one of the layers of the display assembly and one of the touch interface layers.

6. The apparatus as claimed in claim 1, wherein the flexible membrane comprises a suspension ring configured to be located within a recess of the first part, wherein the suspension ring and recess form the first area of contact.

7. The apparatus as claimed in claim 1, wherein the at least two actuators is configured to be further coupled to the first part by a fixed coupling.

8. The apparatus as claimed in claim 1, wherein the at least two actuators is at least one of:
a piezoelectric actuator;
a dynamic eccentric mass actuator;
a moving coil actuator; and
a moving magnet actuator.

9. The apparatus as claimed in claim 1, wherein the flexible membrane comprises at least one of:
an elastomer;
a silicone foil;
a polyethylene terephthalate (PET) polyester film; and
a polycarbonate film.

10. The apparatus as claimed in claim 9, wherein the flexible membrane has a thickness substantially in the range from 0.01 mm to 1 mm.

11. The apparatus as claimed in claim 1, wherein the flexible membrane is coupled to at least one of the first part and the second part by a layer of optically clear adhesive.

12. The apparatus as claimed in claim 1, further comprising a damper coupled between at least one of the actuators and the second part to convert an actuator bending moment to a substantially translational displacement to form the translational planar motion displacement of the second part.

13. The apparatus as claimed in claim 1 wherein the at least two actuators are located at substantially opposite ends of the second part, wherein the at least two actuators at the substantially opposite ends of the second part are configured to actuate at a same time to generate the translational planar motion displacement of the second part.

14. The apparatus as claimed in claim 1 where the at least two actuators are configured to generate the translational planar motion displacement of the second part comprising a portion of the second part, at a location at the flexible membrane, being moved with the same translational planar motion displacement as caused at other portions of the second part at locations of the at least two actuators.

15. The apparatus as claimed in claim 1 where the flexible membrane comprises first and second portions, where the first and second portions of the flexible membrane are located at respective opposite lateral sides of the second part, and where the at least two actuators are configured to generate the translational planar motion displacement of the second part to include the second part at the first and second portions of the flexible membrane.

16. A method of operating an apparatus comprising a first part configured to form at least part of a case of the apparatus and a second part configured to form at least one of: at least one layer of a display assembly for the apparatus and a front window by: coupling the first part to the second part by a flexible membrane attached at a first area of contact to the first part and at a second area of contact to the second part and coupling at least two actuators to the second part to actuate the second part and generate a translational planar motion displacement of the second part when the at least two actuators are actuated, wherein the flexible membrane enables the translational planar motion displacement of the second part to generate sound waves when the second part is actuated by the at least two actuators, where the at least two actuators are configured to generate the translational planar motion displacement of the second part comprising at least one of:
  an entirety of the front window having the translational planar motion displacement, and
  an entirety of the at least one layer of the display assembly having the translational planar motion displacement.

17. The method as claimed in claim 16, wherein the first part comprises a body part, and a frame part, wherein coupling the flexible membrane first area of contact comprises coupling the flexible membrane to at least one of: the body part, the frame part or between the body part and the frame part.

18. The method as claimed in claim 16, wherein the second part comprises the front window as a layer of the display assembly, the at least one layer of the display assembly, and at least one touch interface layer and coupling the flexible membrane second area of contact comprises coupling the flexible membrane to at least one of the layers comprised in the second part.

19. The method as claimed in claim 16, further comprising coupling the flexible membrane to at least one of the first part and the second part by a layer of optically clear adhesive.

20. The method as claimed in claim 16, wherein the coupling of the at least two actuators to the second part, to enable the actuation of the second part to generate the planar motion displacement of the second part, comprises converting a bending moment generated by the at least two actuators into a substantially translational displacement to form the translational planar motion displacement of the second part.

21. The method as claimed in claim 16, further comprising coupling at least one of the actuators to the first part by a fixed coupling.

22. A method as in claim 16 where the at least two actuators are located at substantially opposite ends of the second part, wherein the at least two actuators are actuated at a same time to generate the translational planar motion displacement of the second part.

23. An apparatus comprising:
  a first part configured to form at least part of a case of the apparatus;
  a second part comprising at least one of:
    a front window, and
    at least one layer of a display assembly;
  a flexible membrane at least partially connecting the second part to the first part; and
  at least two actuators coupled to the second part, where the at least two actuators are configured to movingly actuate the second part to generate a translational planar motion displacement of the front window and/or the at least one layer of the display assembly to generate sound waves from the second part when the second part is movingly actuated by the at least two actuators, where the at least two actuators are configured to generate the translational planar motion displacement of the second part comprising at least one of:
    an entirety of the front window having the translational planar motion displacement, and
    an entirety of the at least one layer of the display assembly having the translational planar motion displacement.

24. An apparatus as in claim 23 where the second part comprises the front window as a layer of the display assembly, and at least one touch interface as a layer of the display assembly.

25. An apparatus as in claim 23 where the second part comprises a front planar surface which is configured to be moved translationally as the second part is movingly actuated.

26. An apparatus as in claim 23 where the at least two actuators are located at substantially opposite ends of the second part, wherein the at least two actuators are configured to be actuated at a same time to generate the translational planar motion displacement of the second part.

* * * * *